United States Patent
Higuchi

(10) Patent No.: US 11,948,782 B2
(45) Date of Patent: Apr. 2, 2024

(54) CONTROL SYSTEM, CONTROL METHOD, RECORDING MEDIUM STORING CONTROL PROGRAM, AND PROCESSING SYSTEM

(71) Applicant: Tokyo Electron Limited, Tokyo (JP)

(72) Inventor: Ryuta Higuchi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 707 days.

(21) Appl. No.: 17/101,739

(22) Filed: Nov. 23, 2020

(65) Prior Publication Data

US 2021/0159059 A1  May 27, 2021

(30) Foreign Application Priority Data

Nov. 26, 2019  (JP) .................. 2019-213379

(51) Int. Cl.
*H01J 37/32* (2006.01)
*G05B 13/04* (2006.01)
*G05B 17/00* (2006.01)
*G05B 19/418* (2006.01)

(52) U.S. Cl.
CPC ........ *H01J 37/32926* (2013.01); *G05B 13/04* (2013.01); *G05B 17/00* (2013.01); *G05B 19/41885* (2013.01); *H01J 2237/332* (2013.01); *H01J 2237/334* (2013.01)

(58) Field of Classification Search
CPC ........... H01J 37/32926; H01J 2237/332; H01J 2237/334; H01J 37/32082; H01J 37/32174; G05B 13/04; G05B 17/00; G05B 19/41885; G05B 13/042; G05B 15/02; C23C 16/0245; C23C 16/505; H01L 21/67069

See application file for complete search history.

(56) References Cited

U.S. PATENT DOCUMENTS

2003/0003607 A1* 1/2003 Kagoshima ....... H01J 37/32935
118/712

FOREIGN PATENT DOCUMENTS

JP  2019-071270 A  5/2019

* cited by examiner

*Primary Examiner* — Charles R Kasenge
(74) *Attorney, Agent, or Firm* — Nath, Goldberg & Meyer; Jerald L. Meyer; Tanya E. Harkins

(57) ABSTRACT

A control system includes: a specifying part for specifying a model corresponding to a processing apparatus and a control algorithm that generates a control signal for controlling the processing apparatus; a simulator for simulating the state of the processing apparatus with the model; a first control signal generation part for generating a control signal based on the measurement value by using the control algorithm; a second control signal generation part for generating a control signal based on an output value of the simulator by using the control algorithm; a first adjustment part for adjusting a value of a model parameter included in the model; and a second adjustment part for adjusting a value of a control parameter included in the control algorithm so that an evaluation value calculated for the output value of the simulator becomes closer to a target value.

11 Claims, 6 Drawing Sheets

FIG. 2
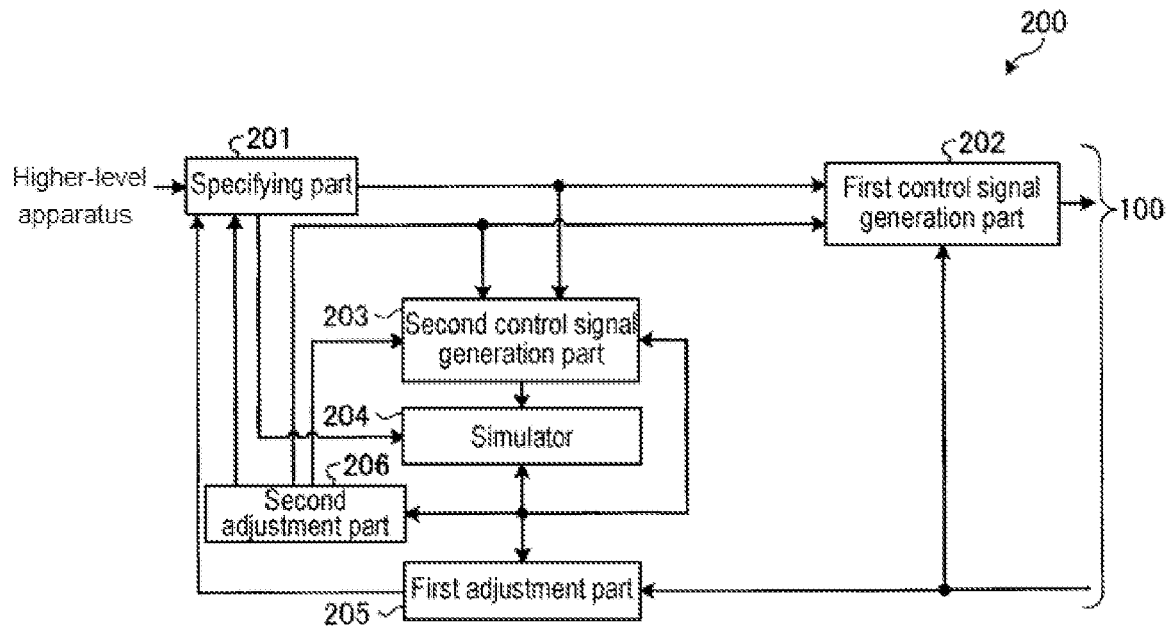
FIG. 3
| Recipe ID | Control algorithm | Initial value of control parameter | Model | Initial value of model parameter |
|---|---|---|---|---|
| R001 | A001 | AP001 | M001 | MP001 |
| R002 | A002 | AP002 | M002 | MP002 |
| ⋮ | ⋮ | ⋮ | ⋮ | ⋮ |
FIG. 4
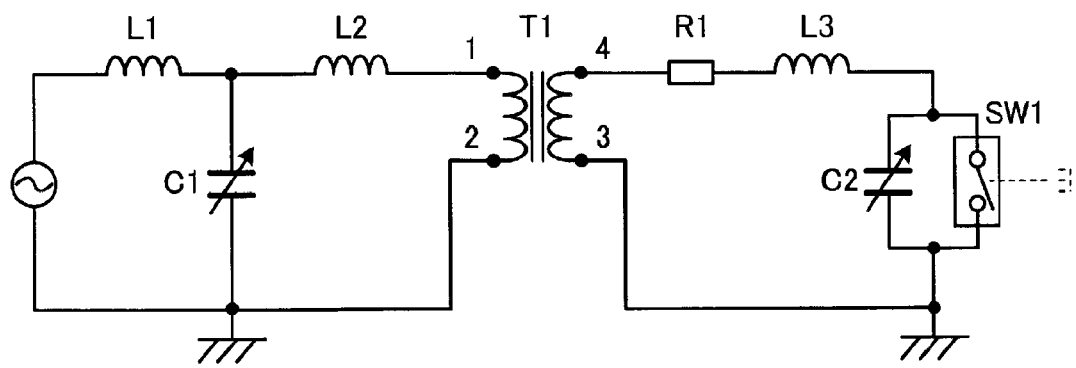

CONTROL SYSTEM, CONTROL METHOD, RECORDING MEDIUM STORING CONTROL PROGRAM, AND PROCESSING SYSTEM

CROSS-REFERENCE TO RELATED APPLICATION

This application is based upon and claims the benefit of priority from Japanese Patent Application No. 2019-213379, filed on Nov. 26, 2019, the entire contents of which are incorporated herein by reference.

TECHNICAL FIELD

Various aspects and embodiments of the present disclosure relate to a control system, a control method, a non-transitory computer-readable recording medium storing a control program, and a processing system.

BACKGROUND

A processing apparatus that performs processing such as etching or the like on a substrate using plasma is required to stably ignite the plasma inside the processing apparatus. In the course of generating the plasma inside the processing apparatus, the impedance of the plasma is changed momentarily, and the optimum constant value in a matching circuit provided between the plasma and a power supply varies depending on the time. The method of changing the constant of the matching circuit to stably ignite the plasma is specified by, for example, repeating an experiment.

PRIOR ART DOCUMENT

Patent Document

Patent Document 1: Japanese Laid-Open Patent Publication No. 2019-071270

SUMMARY

According to one embodiment of the present disclosure, there is provided a control system, which includes: a specifying part configured to, based on a recipe that describes conditions for processing a substrate, specify a model corresponding to a processing apparatus that processes the substrate and a control algorithm that generates a control signal for controlling the processing apparatus based on a measurement value measured by a measurement device provided in the processing apparatus so that a state of the processing apparatus becomes a predetermined state; a simulator configured to simulate the state of the processing apparatus by using the model; a first control signal generation part configured to generate a control signal based on the measurement value by using the control algorithm specified by the specifying part and input the control signal generated by the first control signal generation part to the processing apparatus; a second control signal generation part configured to generate a control signal based on an output value of the simulator, which corresponds to the measurement value, by using the control algorithm specified by the specifying part, and input the control signal generated by the second control signal generation part to the simulator; a first adjustment part configured to adjust a value of a model parameter included in the model so that a difference between the measurement value and the output value of the simulator becomes small; and a second adjustment part configured to adjust a value of a control parameter included in the control algorithm used by the second control signal generation part so that an evaluation value calculated for the output value of the simulator using the model including the adjusted value of the model parameter becomes closer to a target value, wherein the first control signal generation part is configured to generate the control signal by using the value of the control parameter adjusted by the second adjustment part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a diagram illustrating an example of a control system according to a first embodiment.

FIG. 3 is a diagram showing an example of a control table in the first embodiment.

FIG. 4 is a diagram showing an example of a model.

DETAILED DESCRIPTION

Figure 1:
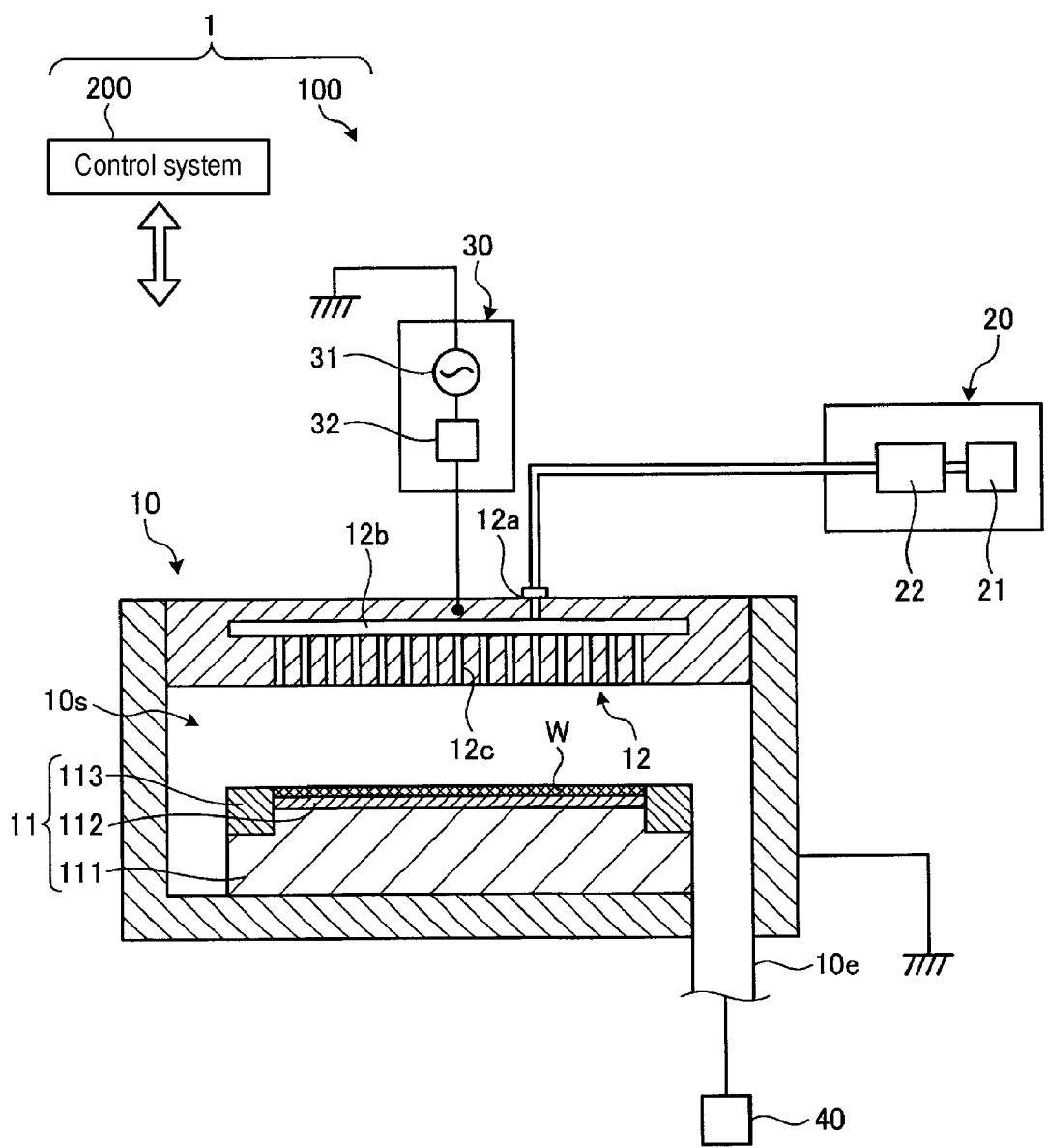
FIG. 1 is a diagram illustrating an example of a processing system according to an embodiment of the present disclosure.

Embodiments of a control system, a control method, a non-transitory computer-readable recording medium storing a control program, and a processing system will be described below in detail with reference to the drawings. The control system, the control method, the non-transitory computer-readable recording medium storing a control program, and the processing system disclosed herein are not limited to the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When the processing on a substrate is repeated, the consumption of internal components of a processing apparatus and the deposition of a reaction by-product (so-called deposit) inside the processing apparatus occur. As a result, the internal state of the processing apparatus is changed, and the impedance of the plasma is further changed. It is also conceivable to change the method of changing the constant of the matching circuit according to the consumption amount of the internal components of the processing apparatus and the deposition amount of the deposit inside the processing apparatus. However, experiments need to be conducted for each of the consumption amount of the internal components and the deposition amount of the deposit, which may lead to an enormous number of experiments. Therefore, it is difficult to change the method of changing the constant of the matching circuit according to the deposition amount of the deposit inside the processing apparatus.

Furthermore, since the dimensional error and the assembly error of components are different for each processing apparatus, the optimal method of changing the constant of the matching circuit for stably igniting the plasma is different for each processing apparatus. Moreover, even in the same processing apparatus, when the consumed components are replaced, the dimensional error and the assembly error may be different before and after the replacement of the consumed components. Therefore, when the method of changing the constant of the matching circuit remains the same before and after replacement of the consumed components, the plasma may not be ignited stably after the replacement of the consumed components. If the method of changing the constant of the matching circuit is changed according to the dimensional error and the assembly error of the consumed components in the processing apparatus as described above, an experiment needs to be conducted for each of the dimensional error and the assembly error of the consumed components. Thus, the number of experiments becomes enormous. Therefore, it is difficult to change the method of changing the constant of the matching circuit according to the dimensional error and the assembly error of the consumed components in the processing apparatus.

Furthermore, in the processing of the substrate, the internal state of the processing apparatus such as the temperature distribution of the substrate and the concentration distribution of the gas inside the processing apparatus in addition to the plasma is changed every moment. In order to stably control the internal state of the processing apparatus to a desired state, the controllable values such the heater power, the gas flow rate, the pressure and the like are required to be controlled to optimum values according to the internal state of the processing apparatus at that time. It may be conceived that the method of changing these values is specified by, for example, repeating experiments. However, it is difficult to conduct experiments for all combinations of factors such as the instrument error of the processing apparatus, the internal state of the processing apparatus, the type of the gas used, the flow rate of the gas, the temperature, the pressure and the like.

Therefore, the present disclosure provides a technique capable of stably controlling the internal state of the processing apparatus.

First Embodiment

[Configuration of Processing System 1]

FIG. 1 is a diagram illustrating an example of a processing system 1 according to an embodiment of the present disclosure. In one embodiment, the processing system 1 includes a processing apparatus 100 and a control system 200. In the present embodiment, the processing apparatus 100 is an apparatus that uses plasma to perform processing such as etching, film formation, modification or the like on a substrate W. The processing apparatus 100 includes a chamber 10, a gas supply part 20, an RF (Radio Frequency) power supply part 30, and an exhaust system 40. The control system 200 controls each part of the processing apparatus 100.

In the present embodiment, the chamber 10 includes a support part 11 and an upper electrode shower head assembly 12. The support part 11 is arranged in a lower region of a processing space 10s inside the chamber 10. The upper electrode shower head assembly 12 is disposed above the support part 11 and may function as a portion of a ceiling plate of the chamber 10.

The support part 11 is configured to support the substrate W in the processing space 10s. In the present embodiment, the support part 11 includes a lower electrode 111, an electrostatic chuck 112, and an edge ring 113. The electrostatic chuck 112 is disposed on the lower electrode 111, and is configured to support the substrate W on an upper surface of the electrostatic chuck 112. A heater (not shown) is provided inside the electrostatic chuck 112. A temperature of the substrate W placed on the electrostatic chuck 112 is controlled by the heater. The edge ring 113 is arranged on an upper surface of a peripheral edge portion of the lower electrode 111 so as to surround the substrate W. A temperature sensor (not shown) that measures the temperature of the substrate W placed on the electrostatic chuck 112 is provided in the electrostatic chuck 112. The temperature measurement value obtained by the temperature sensor is outputted to the control system 200.

The upper electrode shower head assembly 12 is configured to supply one or more kinds of gases from the gas supply part 20 into the processing space 10s. In the present embodiment, the upper electrode shower head assembly 12 includes a gas inlet 12a, a gas diffusion chamber 12b, and a plurality of gas outlets 12c. The gas supply part 20 and the gas diffusion chamber 12b are in fluid communication with each other via the gas inlet 12a. The gas diffusion chamber 12b and the processing space 10s are in fluid communication with each other through the plurality of gas outlets 12c. In the present embodiment, the upper electrode shower head assembly 12 is configured to supply one or more kinds of gases from the gas inlet 12a into the processing space 10s via the gas diffusion chamber 12b and the plurality of gas outlets 12c.

The gas supply part 20 includes one or more gas sources 21 and one or more flow rate controllers 22. In the present embodiment, the gas supply part 20 is configured to supply one or more kinds of process gases from each gas source 21 to each gas inlet 12a through each flow rate controller 22. The flow rate controller 22 may include, for example, a mass flow controller or a pressure-controlled flow rate controller. Additionally, the gas supply part 20 may include one or more flow modulation devices that modulate or pulse flow rates of the one or more processing gases.

The RF power supply part 30 is configured to supply RF power, e.g., one or more RF signals, to one or more electrodes such as the lower electrode 111, the upper electrode shower head assembly 12, or both the lower electrode 111 and the upper electrode shower head assembly 12. In the present embodiment, the RF power supply part 30 includes an RF generator 31 and a matching circuit 32. The RF power supply part 30 according to the present embodiment is configured to supply a first RF signal from the RF generator 31 to the upper electrode shower head assembly 12 via the matching circuit 32. An RF spectrum includes a portion of an electromagnetic spectrum ranging from 3 [Hz] to 3000 [GHz]. As for an electronic material process such as a semiconductor process or the like, the frequency of the RF spectrum used for plasma generation may be a frequency in a range of 100 [kHz] to 3 [GHz], more specifically 200

[kHz] to 150 [MHz]. For example, the frequency of the first RF signal may be a frequency in a range of 27 [MHz] to 100 [MHz].

In the present embodiment, a sensor (not shown) is provided inside the matching circuit 32 to measure the magnitude of reflected power or the like. A measurement value measured by the sensor (not shown) provided in the matching circuit 32 is outputted to the control system 200.

Although not shown, another embodiment is considered here. For example, in an RF power supply part of an alternative embodiment, another RF generator may be configured to supply a second RF signal to the lower electrode 111. The frequency of the second RF signal may be a frequency in a range of, for example, 400 [kHz] to 13.56 [MHz]. In addition, a DC (Direct Current) pulse may be supplied to the lower electrode 111.

Furthermore, although not shown, another embodiment is considered here. For example, in an RF power supply part of an alternative embodiment, an RF generator may be configured to supply a first RF signal to the lower electrode 111, and another RF generator may be configured to supply a second RF signal to the lower electrode 111. A further another RF generator may be configured to supply a third RF signal to the upper electrode shower head assembly 12. Additionally, in a still further alternative embodiment, a DC voltage may be applied to the upper electrode shower head assembly 12. Moreover, in various embodiments, the amplitude of one or more RF signals (i.e., the first RF signal, the second RF signal, etc.) may be pulsed or modulated. Amplitude modulation may include pulsing the amplitude of an RF signal between an ON-state and an OFF-state, or between different ON-states. Further, the phase matching of RF signals may be controlled, and the phase matching of amplitude modulation of the plurality of RF signals may be synchronized or asynchronous.

The exhaust system 40 may be connected to, for example, an exhaust port 10e provided at the bottom of the chamber 10. The exhaust system 40 may include a pressure valve, and a vacuum pump such as a turbo molecular pump, a roughing pump or a combination thereof.

[Configuration of Control System 200]

FIG. 2 is a diagram illustrating an example of a control system 200 according to the first embodiment. The control system 200 includes a specifying part 201, a first control signal generation part 202, a second control signal generation part 203, a simulator 204, a first adjustment part 205, and a second adjustment part 206. The processing apparatus 100 is supplied with a control signal generated by the first control signal generation part 202 and used to control a control target. Examples of the control target may include the frequency of the RF signal, the power of the RF signal, the control amount of a changeable circuit constant (e.g., a variable capacitance or the like) included in the matching circuit 32, the electric power supplied to the heater of the electrostatic chuck 112, the flow rate of the gas, the internal pressure of the chamber 10, and the like. In FIG. 2, there is shown a functional block that generates a control signal for controlling one of the control targets.

The specifying part 201 holds, for example, a control table 2010 as shown in FIG. 3. FIG. 3 is a diagram illustrating an example of the control table 2010 in the first embodiment. In the control table 2010, a control algorithm, an initial value of a control parameter, a model and an initial value of a model parameter are stored in advance in association with a recipe ID that identifies a recipe in which the conditions for processing a substrate W are described. In the present embodiment, the conditions for processing the substrate W using plasma are described in the recipe.

The control algorithm is an algorithm that generates a control signal for controlling the processing apparatus 100 based on the measurement values measured by various sensors provided in the processing apparatus 100 so that the state of the processing apparatus 100 becomes a predetermined state. The control algorithm includes one or more control parameters.

The model is used to simulate the state of the processing apparatus 100. In the present embodiment, the model is a model for simulating the state of plasma generated inside the processing apparatus 100, and is represented by, for example, one or more mathematical expressions. The model contains one or more model parameters. FIG. 4 is a diagram showing an example of the model. In the present embodiment, the model is defined as an electrically equivalent circuit that represents the state of the control target. In FIG. 4, impedances of terminals 1 and 4 of a transformer T1 are referred to as Zin and Zc, respectively. For example, inductances L1, L2 and L3, capacitances C1 and C2, mutual inductance of the transformer T1 and the like, which are shown in FIG. 4, are defined as model parameters.

When a recipe ID is inputted from a higher-level apparatus that controls the selection or execution of the recipe, the specifying part 201 extracts the control algorithm, the initial value of the control parameter, the model and the initial value of the model parameter, which are associated with the respective recipe ID, from the control table 2010. Then, the specifying part 201 outputs the extracted control algorithm and the extracted initial value of the control parameter to the first control signal generation part 202 and the second control signal generation part 203. The specifying part 201 also outputs the extracted model and the extracted initial value of the model parameter to the simulator 204.

The first control signal generation part 202 generates a control signal based on the measurement values measured by the sensors provided in the processing apparatus 100, by using the control algorithm and the initial value of the control parameter outputted from the specifying part 201. Then, the first control signal generation part 202 inputs the generated control signal to the processing apparatus 100. In the present embodiment, the first control signal generation part 202 generates the control signal x by using, for example, one of the mathematical expressions represented in the following equation (1).

$$x_1 = f_1(a_{11}, a_{12}, \ldots, a_{1m}, y_1, y_2, \ldots, y_m)$$
$$x_2 = f_2(a_{21}, a_{22}, \ldots, a_{2m}, y_1, y_2, \ldots, y_m)$$
$$\vdots$$
$$x_n = f_n(a_{n1}, a_{n2}, \ldots, a_{nm}, y_1, y_2, \ldots, y_m)$$

(1)

In the above equation (1), $x_n$ is a control signal inputted to the $n^{th}$ control target, $f_n$ is a control algorithm for controlling the $n^{th}$ control target, $a_{nm}$ is the me control parameter, and $y_m$ is the $m^{th}$ type measurement value.

The simulator 204 simulates the state of the processing apparatus 100 by using the model and the initial value of the model parameter outputted from the specifying part 201. In the present embodiment, the simulator 204 simulates the state of plasma in the processing apparatus 100 by using the model and the initial value of the model parameter outputted from the specifying part 201. Then, the simulator 204 outputs an output value corresponding to the measurement value outputted from the processing apparatus 100, to the second control signal generation part 203, the first adjustment part 205 and the second adjustment part 206. In the present embodiment, the simulator 204 outputs an output value y' by using, for example, the mathematical expressions represented in the following equation (2).

$$y'_1 = M_1(b_{11}, b_{12}, \ldots, b_{1n}, x'_1, x'_2, \ldots, x'_n)$$
$$y'_2 = M_2(b_{21}, b_{22}, \ldots, b_{2n}, x'_1, x'_2, \ldots, x'_n) \quad (2)$$
$$\vdots$$
$$y'_m = M_m(b_{m1}, b_{m2}, \ldots, b_{mn}, x'_1, x'_2, \ldots, x'_n)$$

In the above equation (2), $y'_m$ is an output value corresponding to the $m^{th}$ type measurement value, $M_m$ is a model corresponding to the $m^{th}$ measurement value, $b_{mn}$ is the $mn^{th}$ model parameter, $x'_n$ is a control signal corresponding to the $n^{th}$ control target.

The second control signal generation part 203 generates a control signal based on the output value outputted from the simulator 204, by using the control algorithm and the initial value of the control parameter outputted from the specifying part 201. Then, the second control signal generation part 203 inputs the generated control signal to the simulator 204. In the present embodiment, the second control signal generation part 203 generates a control signal x' by using, for example, one of the mathematical expressions represented in the following equation (3).

$$x'_1 = f_1(a_{11}, a_{12}, \ldots, a_{1m}, y'_1, y'_2, \ldots, y'_m) \quad (3)$$
$$x'_2 = f_2(a_{21}, a_{22}, \ldots, a_{2m}, y'_1, y'_2, \ldots, y'_m)$$
$$\vdots$$
$$x'_n = f_n(a_{n1}, a_{n2}, \ldots, a_{nm}, y'_1, y'_2, \ldots, y'_m)$$

In the above equation (3), $x'_n$ is a control signal corresponding to an $n^{th}$ control target, and $y'_m$ is an output value of the simulator 204, which corresponds to an $m^{th}$ type measurement value.

The first adjustment part 205 adjusts the value of the model parameter of the model used in the simulator 204 so that a difference between the measurement value outputted from the processing apparatus 100 and the output value of the simulator 204 corresponding to the measurement value becomes small. For example, the first adjustment part 205 calculates an evaluation value $E_1$ that evaluates the difference between the measurement value and the output value, based on the mathematical expression represented in the following equation (4).

$$E_1 = e_1(\Delta y_1, \Delta y_2, \ldots, \Delta y_m) \quad (4)$$

In the above equation (4), $e_1$ is an evaluation function, and $\Delta y_m$ is a difference between an $m^{th}$ type measurement value and the output value of the simulator 204 corresponding to the respective measurement value. In the present embodiment, the smaller the difference between the measurement value outputted from the processing apparatus 100 and the output value of the simulator 204 corresponding to the respective measurement value, the smaller the evaluation value $E_1$.

The first adjustment part 205 adjusts the value of the model parameter so that the evaluation value $E_1$ based on the above equation (4) becomes equal to or less than a predetermined threshold value. The first adjustment part 205 adjusts the value of the model parameter by a method for statistically calculating the likelihood, such as a MIN-MAX method, a weighted average method, a Fuzzy control method or the like. For example, the first adjustment part 205 adjusts the value of the model parameter by repeating the calculation of the output value by the simulator 204, the calculation of the evaluation value $E_1$ based on the above equation (4), and the change of the value of the model parameter.

When the evaluation value $E_1$ based on the above equation (4) becomes equal to or less than the threshold value, the difference between the measurement value outputted from the processing apparatus 100 and the output value of the simulator 204 corresponding to the respective measurement value becomes small, and the state of the model including the adjusted value of the model parameter becomes close to the state of the processing apparatus 100.

When the evaluation value $E_1$ based on the above equation (4) becomes equal to or less than the threshold value, the first adjustment part 205 updates the initial value of the model parameter in the control table 2010 with the adjusted value of the model parameter. As a result, it is possible to perform the simulation by following the change in the state of the processing apparatus 100, which includes a time-dependent change, and using the model having a state closer to the state of the processing apparatus 100.

The second adjustment part 206 calculates an evaluation value $E_2$ for the output value of the simulator 204 using the model including the adjusted value of the model parameter. Then, the second adjustment part 206 adjusts the value of the control parameter included in the control algorithm used by the second control signal generation part 203 so that the calculated evaluation value $E_2$ approaches a target value. After the adjustment of the value of the model parameter by the first adjustment part 205 is completed, the second adjustment part 206 calculates the evaluation value $E_2$ for the target value with respect to the output value of the simulator 204 using the model including the adjusted value of the model parameter by using the following equation (5).

$$E_2 = e_2(\Delta c_1, \Delta c_2, \ldots, \Delta c_k) \quad (5)$$

In the above equation (5), $e_2$ is an evaluation function, and $\Delta c_k$ is a difference between the output value of the kth type or the characteristic value calculated from the output value and the target value. The output value is a value corresponding to the measurement value of the processing apparatus 100, and is, for example, the magnitude of reflected power. The characteristic value calculated from the output value is, for example, the time required for the reflected power to become equal to or less than a predetermined value, the magnitude of overshooting or hunting, and the like.

The second adjustment part 206 adjusts the value of the control parameter included in the control algorithm used by the second control signal generation part 203 so that the evaluation value $E_2$ based on the above equation (5) becomes closer to a target value $E_0$. For example, the second adjustment part 206 adjusts the value of the control parameter so that the difference between the evaluation value $E_2$ based on the above equation (5) and the target value $E_0$ becomes equal to or less than a predetermined threshold value. The second adjustment part 206 adjusts the value of the control parameter by a method for statistically calculating the likelihood, such as a MIN-MAX method, a weighted average method, a Fuzzy control method or the like. For example, the second adjustment part 206 adjusts the value of the control parameter by repeating the generation of the control signal by the second control signal generation part 203, the generation of the output value of the simulator 204 that receives the generated control signal, the calculation of the evaluation value $E_2$, and the change of the value of the control parameter.

The state of the model including the adjusted model parameter can be brought closer to the target state by the control signal generated from the control algorithm including the value of the control parameter adjusted so that the difference between the evaluation value $E_2$ based on the above equation (5) and the target value $E_0$ becomes equal to or less than the threshold value. The model including the adjusted value of the model parameter is a model having a state closer to the state of the processing apparatus 100. Therefore, the state of the processing apparatus 100 can be brought closer to the target state by the control signal generated from the control algorithm including the value of the control parameter adjusted so that the difference between the evaluation value $E_2$ based on the above equation (5) and the target value $E_0$ becomes equal to or less than the threshold value.

The second adjustment part 206 outputs the adjusted control parameter to the first control signal generation part 202 and the second control signal generation part 203. The first control signal generation part 202 generates a control signal based on the measurement values measured by the sensors provided in the processing apparatus 100, by using the control algorithm including the adjusted value of the control parameter outputted from the second adjustment part 206. As a result, it is possible to stably control the state of the processing apparatus 100 so as to come closer to the target state by following the change in the state of the processing apparatus 100, which includes a time-dependent change.

The second control signal generation part 203 generate a control signal based on the output value outputted from the simulator 204, by using the control algorithm including the adjusted value of the control parameter outputted from the second adjustment part 206, and inputs the generated control signal to the simulator 204.

Furthermore, the second adjustment part 206 updates the initial value of the control parameter in the control table 2010 with the adjusted value of the control parameter. As a result, it is possible to more quickly control the state of the processing apparatus 100 so as to come closer to the target state by following the change in the state of the processing apparatus 100, which includes a time-dependent change.

[Processing of Control System 200]

Figure 5:
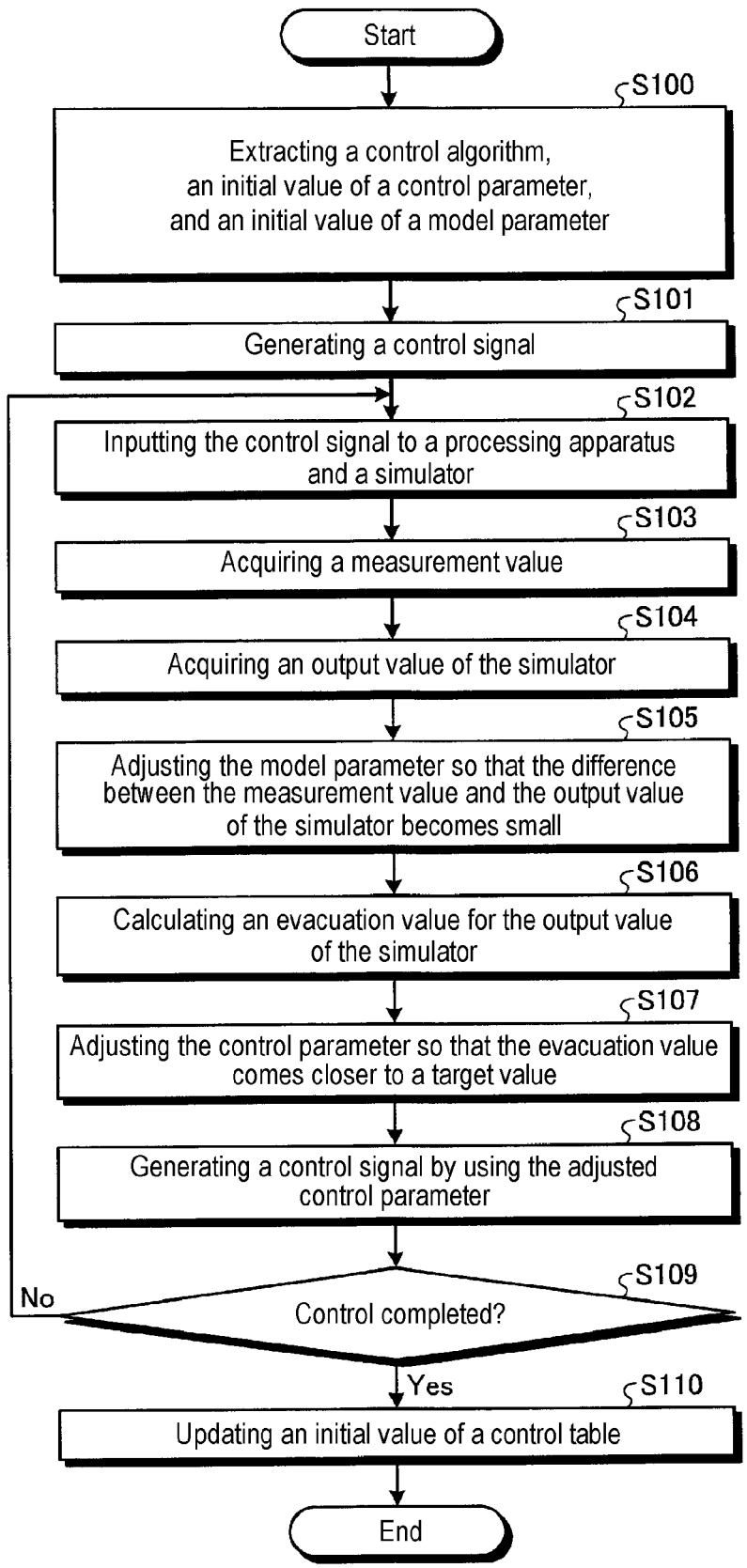
FIG. 5 is a flowchart showing an example of processing of a control system.

FIG. 5 is a flowchart showing an example of processing of the control system 200. For example, when the recipe ID is inputted from a higher-level apparatus, the control system 200 starts the processing shown in the flowchart.

First, the specifying part 201 extracts, from the control table 2010, the control algorithm, the initial value of the control parameter, the model and the initial value of the model parameter associated with the recipe ID inputted from the higher-level apparatus (S100). Then, the specifying part 201 outputs the extracted control algorithm and the extracted initial value of the control parameter to the first control signal generation part 202 and the second control signal generation part 203. Moreover, the specifying part 201 outputs the extracted model and the extracted initial value of the model parameter to the simulator 204.

The first control signal generation part 202 generates a control signal by using the control algorithm and the initial value of the control parameter outputted from the specifying part 201 (S101). In addition, the second control signal generation part 203 generates a control signal by using the control algorithm and the initial value of the control parameter outputted from the specifying part 201 (S101).

Subsequently, the first control signal generation part 202 inputs the generated control signal to the processing apparatus 100, and the second control signal generation part 203 inputs the generated control signal to the simulator 204 (S102). The processing apparatus 100 operates the control target according to the inputted control signal. As a result, the state of the processing apparatus 100 is changed. The simulator 204 changes the state of the model according to the inputted control signal. Thereafter, the first control signal generation part 202 generates a control signal according to the control algorithm based on the measurement value measured by the sensor provided in the processing apparatus 100, and inputs the generated control signal to the processing apparatus 100. In addition, the second control signal generation part 203 generates a control signal according to the control algorithm based on the output value outputted from the simulator 204, and inputs the generated control signal to the simulator 204.

Subsequently, the first adjustment part 205 acquires the measurement value from the processing apparatus 100 (S103) and acquires the output value from the simulator 204 (S104). Then, the first adjustment part 205 adjusts the value of the model parameter of the model used in the simulator 204 so that the difference between the measurement value outputted from the processing apparatus 100 and the output value of the simulator 204 corresponding to the respective measurement value becomes small (S105).

Subsequently, the second adjustment part 206 calculates the evaluation value $E_2$ for the output value of the simulator 204 by using the model including the adjusted value of the model parameter (S106). Then, the second adjustment part 206 adjusts the value of the control parameter included in the control algorithm used by the second control signal generation part 203 so that the calculated evaluation value $E_2$ becomes closer to the target value $E_0$ (S107).

Subsequently, the second adjustment part 206 outputs the adjusted value of the control parameter to the first control signal generation part 202 and the second control signal generation part 203. The first control signal generation part 202 generates a control signal based on the measurement value measured by the sensor provided in the processing apparatus 100, by using the control algorithm including the adjusted value of the control parameter outputted from the second adjustment part 206 (S108). In addition, the second control signal generation part 203 generates a control signal based on the output value outputted from the simulator 20, by using the control algorithm including the adjusted value of the control parameter outputted from the second adjustment part 206.

Subsequently, the first adjustment part 205 and the second adjustment part 206 determine whether or not the control of the processing apparatus 100 corresponding to the recipe ID inputted from the higher-level apparatus is complete). When the control of the processing apparatus 100 is determined to be not completed (S109: No), the processing shown in step S102 is executed again.

On the other hand, when the control of the processing apparatus 100 is determined to completed (S109: Yes), the first adjustment part 205 updates the initial value of the model parameter in the control table 2010 with the adjusted value of the model parameter (S110). In addition, the second adjustment part 206 updates the initial value of the control parameter in the control table 2010 with the adjusted value of the control parameter (S110). Then, the processing shown in the flowchart is completed.

[Hardware]

Figure 6:
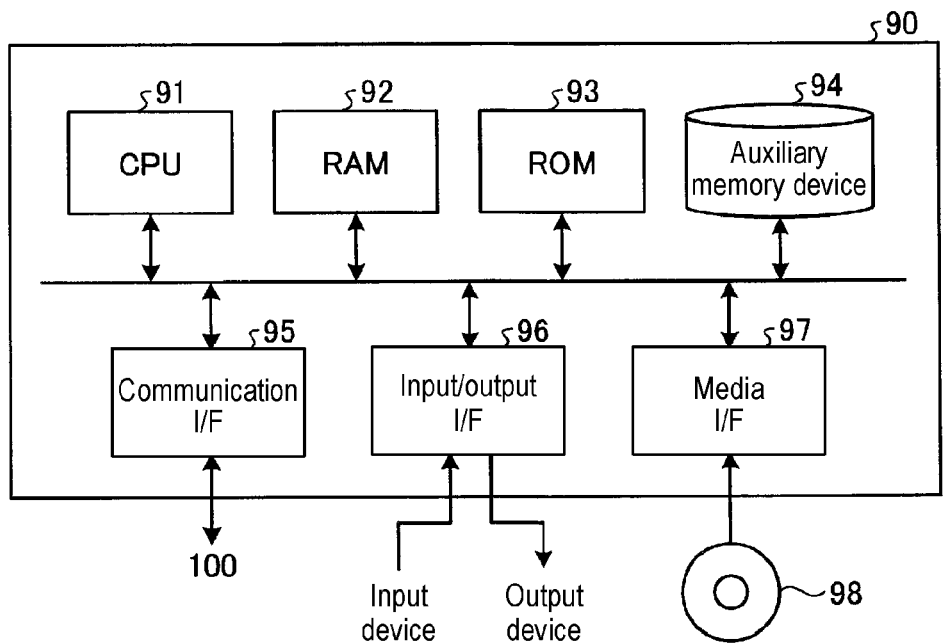
FIG. 6 is a diagram illustrating an example of a computer that implements the functions of the control system.

The control system 200 is implemented by, for example, a computer 90 having a configuration shown in FIG. 6. FIG. 6 is a diagram showing an example of the computer 90 that implements the functions of the control system 200. The computer 90 includes a CPU (Central Processing Unit) 91, a RAM (Random Access Memory) 92, a ROM (Read Only Memory) 93, an auxiliary memory device 94, a communication I/F (interface) 95, an input/output I/F 96, and a media I/F 97.

The CPU 91 operates based on a program stored in the ROM 93 or the auxiliary memory device 94, and controls each part. The ROM 93 stores a boot program to be executed by the CPU 91 when the computer 90 is started, a program that depends on the hardware of the computer 90, and the like.

The auxiliary memory device 94 is, for example, an HDD (Hard Disk Drive) or an SSD (Solid State Drive), and stores a program to be executed by the CPU 91, data used by the program, and the like. The CPU 91 reads the program from the auxiliary memory device 94, loads the read program onto the RAM 92, and executes the loaded program.

The communication I/F 95 performs communication with the processing apparatus 100 via a communication line such as a LAN (Local Area Network) or the like. The communication I/F 95 receives data from the processing apparatus 100 via the communication line and sends the received data to the CPU 91. The communication I/F 95 transmits the data generated by the CPU 91 to the processing apparatus 100 via the communication line.

The CPU 91 controls an input device such as a keyboard or the like and an output device such as a display or the like via the input/output I/F 96. The CPU 91 acquires a signal inputted from the input device via the input/output I/F 96 and sends the signal to the CPU 91. Further, the CPU 91 outputs the generated data to the output device via the input/output I/F 96.

The media I/F 97 reads a program or data stored in the recording medium 98 and stores the read program or data in the auxiliary memory device 94. The recording medium 98 is, for example, an optical recording medium such as a DVD (Digital Versatile Disc), a PD (Phase Change Rewritable Disk) or the like, a magneto-optical recording medium such as an MO (Magneto-Optical) disk or the like, a tape medium, a magnetic recording medium, a semiconductor memory, or the like.

The CPU 91 of the computer 90 executes the program loaded onto the RAM 92, thereby implementing the function of each of the specifying part 201, the first control signal generation part 202, the second control signal generation part 203, the simulator 204, the first adjustment part 205 and the second adjustment part 206. Further, the data of the control table 2010 is stored in the auxiliary memory device 94.

The CPU 91 of the computer 90 reads the program loaded onto the RAM 92 from the recording medium 98 and stores the read program in the auxiliary memory device 94. As another example, the CPU 91 may acquire a program from another device via a communication line and may store the acquired program in the auxiliary memory device 94.

The first embodiment has been described above. As described above, the control system 200 according to the present embodiment includes the specifying part 201, the first control signal generation part 202, the second control signal generation part 203, the simulator 204, the first adjustment part 205, and the second adjustment part 206. The specifying part 201 specifies the model corresponding to the processing apparatus 100 for processing the substrate W, and the control algorithm, based on the recipe that describes the conditions for processing the substrate W. The control algorithm is an algorithm that generates a control signal for controlling the processing apparatus 100 based on the measurement value measured by the measurement device provided in the processing apparatus 100 so that the state of the processing apparatus 100 becomes a predetermined state. The simulator 204 simulates the state of the processing apparatus 100 by using the model. The first control signal generation part 202 generates a control signal based on the measurement value by using the control algorithm specified by the specifying part 201, and inputs the generated control signal to the processing apparatus 100. The second control signal generation part 203 generates a control signal based on the output value of the simulator 204 corresponding to the measurement value by using the control algorithm specified by the specifying part 201, and inputs the generated control signal to the simulator 204. The first adjustment part 205 adjusts the value of the model parameter included in the model so that the difference between the measurement value and the output value of the simulator 204 becomes small. The second adjustment part 206 adjusts the value of the control parameter included in the control algorithm used by the second control signal generation part 203 so that the evaluation value calculated for the output value of the simulator 204 using the model including the adjusted value of the model parameter becomes closer to the target value. Furthermore, the first control signal generation part 202 generates a control signal using the value of the control parameter adjusted by the second adjustment part 206. As a result, it is possible to stably control the internal state of the processing apparatus 100.

Furthermore, in the above-described embodiment, the specifying part 201 specifies the initial value of the control parameter based on the recipe. The first control signal generation part 202 generates a control signal based on the measurement value by using the control algorithm specified by the specifying part 201 and the initial value of the control parameter, and inputs the generated control signal to the processing apparatus 100. In addition, the specifying part 201 specifies the value of the control parameter adjusted by the second adjustment part 206 as the initial value of the control parameter. As a result, it is possible to more quickly control the state of the processing apparatus 100 so as to come closer to the target state by following the change in the state of the processing apparatus 100, which includes a time-dependent change.

Furthermore, in the above-described embodiment, the recipe describes the conditions for processing the substrate W through the use of plasma, the processing apparatus 100 is an apparatus for processing the substrate W through the use of plasma, and the model is a model that represents the state of plasma. The simulator 204 simulates the state of plasma inside the processing apparatus 100 through the use of the model. As a result, it is possible to stably generate plasma inside the processing apparatus 100 by following the change in the state of the processing apparatus 100, which includes a time-dependent change.

The control method according to the above-described embodiment includes: a step of, based on a recipe that describes conditions for processing a substrate W, specifying a model corresponding to the processing apparatus 100 that processes the substrate W, and a control algorithm that generates a control signal for controlling the processing apparatus 100 based on a measurement value measured by a measurement device provided in the processing apparatus 100 so that the state of the processing apparatus 100 becomes a predetermined state; a step of generating a control signal based on the measurement value by using the specified control algorithm and inputting the generated control signal to the processing apparatus 100; a step of generating a control signal based on an output value corresponding to the measurement value, as an output value of the simulator 204 that simulates the state of the processing apparatus 100 through the use of the model, by using the specified control algorithm, and inputting the generated control signal to the simulator 204; a step of adjusting a value of a model parameter included in the model so that a difference between the measurement value and the output value of the simulator 204 becomes small; and a step of adjusting a value of a control parameter included in the control algorithm so that an evaluation value calculated for the output value of the simulator 204 using the model including the adjusted value of the model parameter becomes closer to a target value. Furthermore, in the step of inputting the generated control signal to the processing apparatus 100, the control signal is generated by using the adjusted value of the control parameter. As a result, it is possible to stably control the internal state of the processing apparatus 100.

Furthermore, the control program according to the above-described embodiment causes the control system 200 to execute a process of: based on a recipe that describes conditions for processing the substrate W, specifying a model corresponding to the processing apparatus 100 that processes the substrate W and a control algorithm that generates a control signal for controlling the processing apparatus 100 based on a measurement value measured by a measurement device provided in the processing apparatus 100 so that the state of the processing apparatus 100 becomes a predetermined state; generating a control signal based on the measurement value by using the specified control algorithm, and inputting the generated control signal to the processing apparatus 100; generating a control signal based on an output value corresponding to the measurement value, as an output value of a simulator 204 that simulates the state of the processing apparatus 100, by using the specified control algorithm, and inputting the generated control signal to the simulator 204; adjusting a value of a model parameter included in the model so that a difference between the measurement value and the output value of the simulator 204 becomes small; and adjusting a value of a control parameter included in the control algorithm so that an evaluation value calculated for the output value of the simulator 204 using the model including the adjusted value of the model parameter becomes closer to a target value. Furthermore, in the process of inputting the generated control signal to the processing apparatus 100, the control signal is generated by using the adjusted value of the control parameter. As a result, it is possible to stably control the internal state of the processing apparatus 100.

Furthermore, the processing system 1 according to the above-described embodiment includes the processing apparatus 100 that processes the substrate W and the control system 200 that controls the processing apparatus 100. The control system 200 includes the specifying part 201, the first control signal generation part 202, the second control signal generation part 203, the simulator 204, the first adjustment part 205, and the second adjustment part 206. The specifying part 201 specifies a model corresponding to the processing apparatus 100 that processes the substrate W and a control algorithm based on a recipe that describes conditions for processing the substrate W. The control algorithm is an algorithm that generates a control signal for controlling the processing apparatus 100 based on a measurement value measured by a measurement device provided in the processing apparatus 100 so that the state of the processing apparatus 100 becomes a predetermined state. The simulator 204 simulates the state of the processing apparatus 100 by using the model. The first control signal generation part 202 generates a control signal based on the measurement value by using the control algorithm specified by the specifying part 201 and inputs the generated control signal to the processing apparatus 100. The second control signal generation part 203 generates a control signal based on an output value of the simulator 204 corresponding to the measurement value by using the control algorithm specified by the specifying part 201 and inputs the generated control signal to the simulator 204. The first adjustment part 205 adjusts a value of a model parameter included in the model so that a difference between the measurement value and the output value of the simulator 204 becomes small. The second adjustment part 206 adjusts a value of a control parameter included in the control algorithm used by the second control signal generation part 203 so that an evaluation value calculated for the output value of the simulator 204 using the model including the adjusted value of the model parameter becomes closer to a target value. Furthermore, the first control signal generation part 202 generates a control signal by using the value of the control parameter adjusted by the second adjustment part 206. As a result, it is possible to stably control the internal state of the processing apparatus 100.

Second Embodiment

In the first embodiment described above, one control algorithm and one model are associated with the recipe ID in advance, and when the recipe ID is inputted from the higher-level apparatus, the control algorithm and the model associated with the recipe ID are specified one by one. On the other hand, in a second embodiment, a plurality of control algorithms and a plurality of models are associated with a recipe ID in advance, and when the recipe ID is inputted from a higher-level apparatus, the plurality of control algorithms and the plurality of models associated with the recipe ID are specified.

Figure 7:
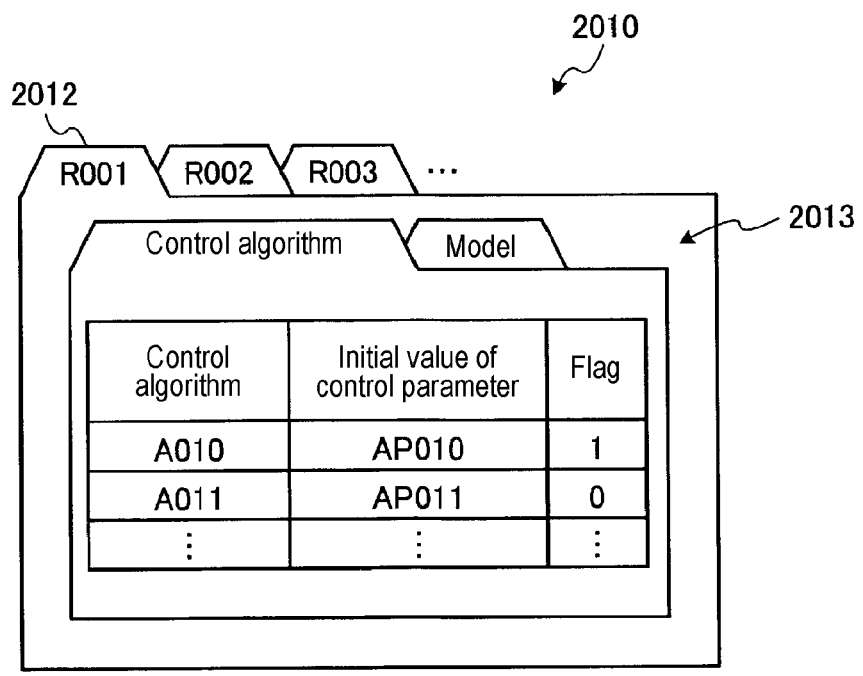
FIG. 7 is a diagram showing an example of a control table in a second embodiment.
Figure 8:
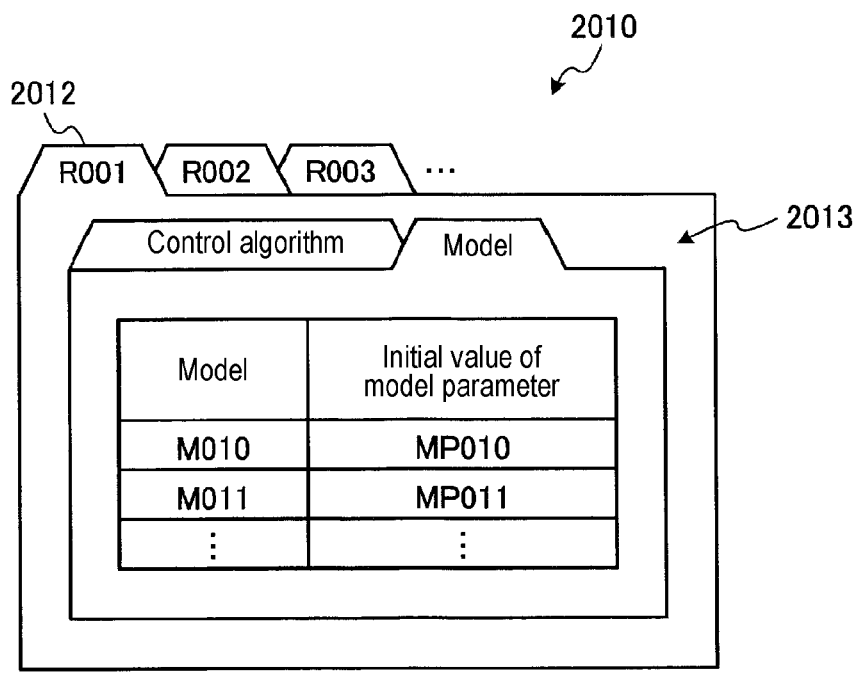
FIG. 8 is a diagram showing the example of the control table in the second embodiment.

FIGS. 7 and 8 are diagrams showing an example of a control table 2010 in the second embodiment. In the control table 2010 of the present embodiment, an individual table 2013 is stored in advance in association with a recipe ID 2012. In the individual table 2013, for example, as shown in FIG. 7, a plurality of control algorithms, initial values of control parameters included in the respective control algorithms, and flags are stored. Each of the flags is a flag for identifying the control algorithm and the initial value of the control parameter used to generate the control signal to be supplied to the processing apparatus 100. In the present embodiment, a flag having a value of "1" is associated with a combination of a control algorithm and an initial value of a control parameter used to generate a control signal to be supplied to the processing application 100. A flag having a value of "0" is associated with other combinations.

Furthermore, in the individual table 2013, for example, as shown in FIG. 8, a plurality of models and initial values of model parameters included in the respective models are stored.

In the present embodiment, when the recipe ID is inputted from the higher-level apparatus, the specifying part 201 extracts, from the control table 2010, a plurality of control algorithms, control parameters, flag values, models and model parameters associated with the recipe ID. Then, the specifying part 201 outputs the combination of the extracted control algorithm and the extracted initial value of the control parameter, with which the flag having the value "1" is associated, to the first control signal generation part 202 and the second control signal generation part 203. Moreover, the specifying part 201 outputs the extracted plurality of control algorithms and the extracted initial values of the control parameters to the second adjustment part 206. In addition, the specifying part 201 outputs the extracted plurality of models and the extracted initial values of the model parameters to the simulator 204.

The second control signal generation part 203 generates a control signal based on the output value outputted from the simulator 204 by using the combination of the control algorithm and the initial value of the control parameter outputted from the specifying part 201, and inputs the generated control signal to the simulator 204. Then, in response to an instruction from the second adjustment part 206, the second control signal generation part 203 changes the combination of the control algorithm and the initial value of the control parameter, generates a control signal based on the output value outputted from the simulator 204, and inputs the generated control signal to the simulator 204.

The simulator 204 outputs an output value based on the control signal outputted from the second control signal generation part 203 to the first adjustment part 205 and the second adjustment part 206 for each model outputted from the specifying part 201.

The first adjustment part 205 adjusts the value of the model parameter for each model so that the evaluation value $E_1$ based on the above equation (4) becomes equal to or less than a predetermined threshold value. Even in a model in which the evaluation value $E_1$ is equal to or less than the threshold value, the minimum value of the evaluation value $E_1$ may differ for each model. The first adjustment part 205 specifies the combination of the model and the value of the model parameter having the evaluation value $E_1$ equal to or less than the threshold value and having the smallest evaluation value $E_1$ as the adjusted model and the adjusted value of the model parameter.

Subsequently, the first adjustment part 205 updates the initial value of the model parameter, which is stored in the individual table 2013 of the control table 2010 in association with the specified model, with the adjusted value of the model parameter.

The second adjustment part 206 adjusts the value of the control parameter for each control algorithm so that the difference between the evaluation value $E_2$ based on the above equation (5) and the target value $E_0$ becomes equal to or less than a predetermined threshold value. Even in an algorithm in which the difference between the evaluation value $E_2$ and the target value $E_0$ is equal to or less than the threshold value, the minimum value of the difference between the evaluation value $E_2$ and the target value $E_0$ may differ for each control algorithm. The first adjustment part 205 specifies the combination of the control algorithm and the control parameter in which the difference between the evaluation value $E_2$ and the target value $E_0$ is equal to or less than the threshold value and in which the difference is smallest, as the adjusted control algorithm and the adjusted value of the control parameter.

Subsequently, the second adjustment part 206 outputs the specified control algorithm and the specified value of the control parameter to the first control signal generation part 202 and the second control signal generation part 203. Furthermore, the second adjustment part 206 updates the initial value of the control parameter, which is stored in the individual table 2013 of the control table 2010 in association with the specified control algorithm, with the adjusted value of the control parameter. Then, the second adjustment part 206 sets "1" to the value of the flag associated with the updated initial value of the control parameter, and sets "0" to the value of the flag associated with the initial values of other control parameters.

In the control table 2010 of the present embodiment, the plurality of control algorithms and the plurality of models are associated with the recipe ID. In another embodiment, either the plurality of control algorithms or the plurality of models may be associated with the recipe ID.

The second embodiment has been described above. As described above, in the control system 200 of the present embodiment, the specifying part 201 specifies the plurality of models based on the recipe. The first adjustment part 205 adjusts the value of the model parameter included in the model for each of the plurality of models specified by the specifying part 201 so that the difference between the measurement value and the output value of the simulator 204 becomes small. The first adjustment part 205 specifies the combination of the adjusted model and the adjusted value of the model parameter, in which the difference between the measurement value and the output value of the simulator 204 corresponding to the respective measurement value is smallest, as the adjusted model and the adjusted value of the model parameter. In addition, the second adjustment part 206 adjusts the value of the control parameter used in the second control signal generation part 203 so that the evaluation value $E_2$ calculated for the output value of the simulator 204 using the model including the value of the model parameter specified by the first adjustment part 205 becomes closer to the target value $E_0$. As a result, it is possible to generate a model closer to the state of the processing apparatus 100.

Furthermore, in the above-described embodiment, the specifying part 201 specifies the plurality of control algorithms based on the recipe. The second adjustment part 206 adjusts the value of the control parameter used in the second control signal generation part 203 for each of the plurality of control algorithms specified by the specifying part 201 so that the evaluation value $E_2$ calculated for the output value of the simulator 204 using the model including the value of the model parameter specified by the first adjustment part 205 becomes closer to the target value $E_0$. The second adjustment part 206 specifies the combination of the adjusted control algorithm and the adjusted value of the control parameter, in which the evaluation value $E_2$ calculated for the output value of the simulator 204 is closest to the target value $E_0$, as the adjusted control algorithm and the adjusted value of the control parameter. The first control signal generation part 202 generates a control signal to be inputted to the processing apparatus 100 based on the measurement value by using the control algorithm and the value of the control parameter specified by the second adjustment part 206. As a result, it is possible to more accurately control the processing apparatus 100.

Third Embodiment

In the first embodiment described above, the value of the control parameter last adjusted before the processing in the processing apparatus 100 is completed is updated as the initial value of the control parameter. On the other hand, in a third embodiment, each time when the value of the control parameter is adjusted, the adjusted value of the control parameter is saved as a history. Then, when the processing in the processing apparatus 100 is started, the initial value of the control parameter is estimated from the history of the adjusted value of the control parameter, and the control of the processing apparatus 100 is started by using the estimated initial value of the control parameter. As a result, the control of the processing apparatus 100 can be started from a state close to the target state, and the state of the processing apparatus 100 can be more quickly brought closer to the target state.

Figure 9:
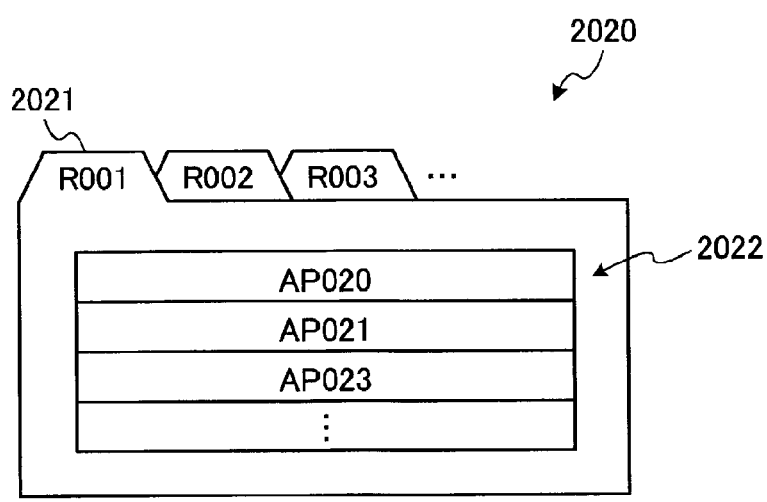
FIG. 9 is a diagram showing an example of a history table.

In the present embodiment, the specifying part 201 holds a history table 2020 as shown in FIG. 9, for example. FIG. 9 is a diagram showing an example of the history table 2020. In the history table 2020, an individual table 2022 is stored in association with a recipe ID 2021. In the individual table 2022, for example, as shown in FIG. 9, the adjusted values of the control parameter values are stored in time series.

When the recipe ID is inputted from a higher-level apparatus, the specifying part 201 refers to the history table 2020, and determines whether or not two or more adjusted values of the control parameters are stored in the individual table 2022 associated with the inputted recipe ID. If the number of the adjusted values of the control parameters stored in the individual table 2022 in association with the recipe ID is 1 or less, the specifying part 201 extracts the initial value of the control parameter associated with the recipe ID from the control table 2010 (see FIG. 3).

On the other hand, when the number of the adjusted values of the control parameters stored in the individual table 2022 in association with the recipe ID is 2 or more, the specifying part 201 extracts the adjusted values of the control parameters associated with the recipe ID from the individual table 2022. Then, the specifying part 201 estimates the value conforming to the tendency of change in the extracted values of the control parameters as an initial value of the control parameters.

Figure 10:
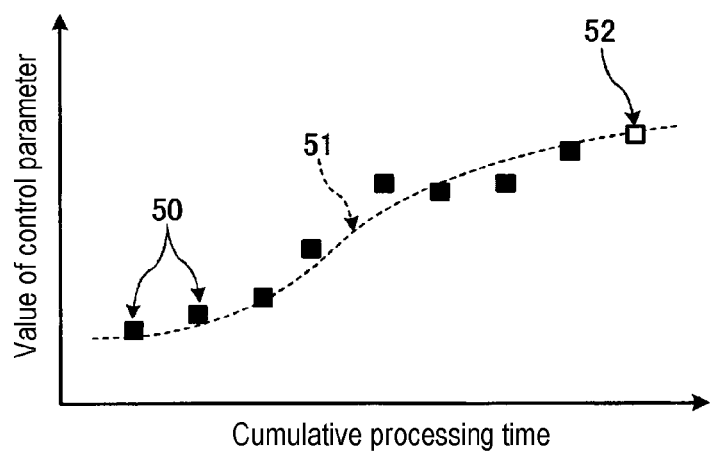
FIG. 10 is a diagram for explaining an example of a method of estimating an initial value of a control parameter.

As shown in FIG. 10, for example, the specifying part 201 specifies an approximation curve 51 that approximates the tendency of change in the adjusted values of the control parameters 50 arranged in time series. FIG. 10 is a diagram for explaining an example of a method of estimating an initial value of a control parameter. The tendency of the change in the adjusted values of the control parameters 50 arranged in time series may be approximated by a straight line. Then, the specifying part 201 estimates the initial value of the control parameter 52 from the values on the specified approximation curve 51.

The third embodiment has been described above. As described above, in the control system 200 of the present embodiment, the specifying part 201 estimates the value conforming to the tendency of the history as the initial value of the control parameter based on the history of the values of the control parameters adjusted by the second adjustment part 206. The first control signal generation part 202 generates a control signal based on the measurement value by using the control algorithm specified by the specifying part 201 and the initial value of the control parameter estimated by the specifying part 201, and inputs the generated control signal to the processing apparatus 100. As a result, the control of the processing apparatus 100 can be started from the state close to the target state, and the state of the processing apparatus 100 can be more quickly brought closer to the target state.

Fourth Embodiment

The control system 200 according to the first embodiment described above is implemented by a single apparatus. On the other hand, the control system 200 according to a fourth embodiment is implemented by double apparatuses.

Figure 11:
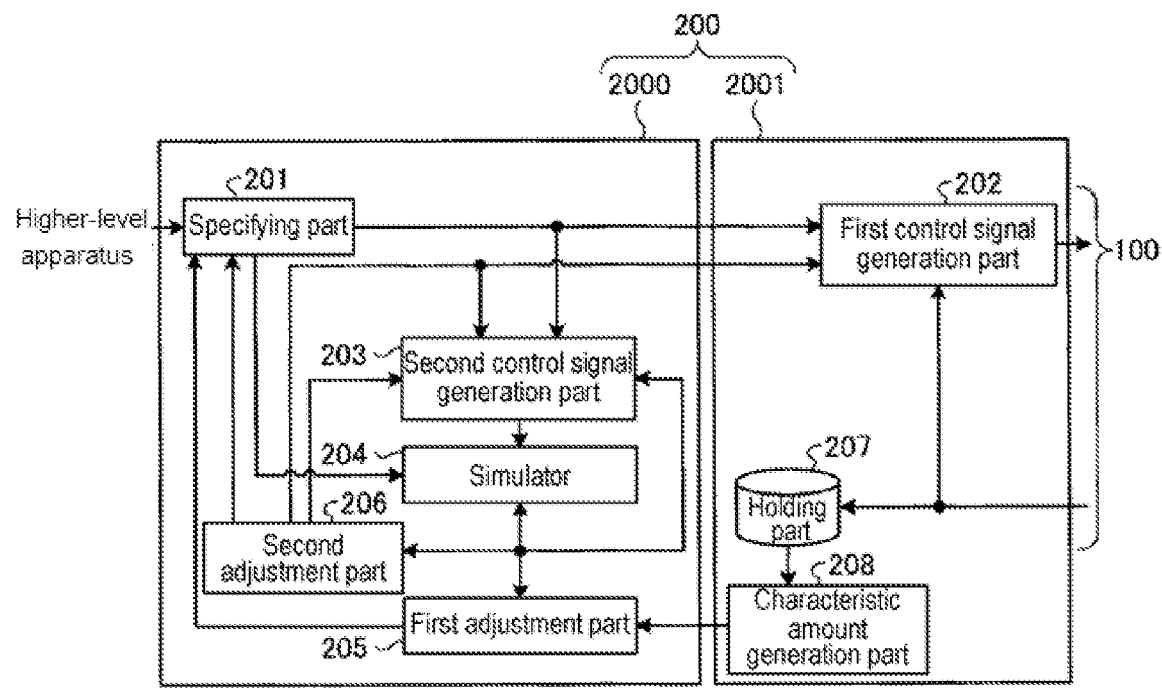
FIG. 11 is a diagram illustrating an example of a control system according to a fourth embodiment.

FIG. 11 is a diagram showing an example of a control system 200 according to a fourth embodiment. The control system 200 according to the present embodiment includes a first apparatus 2000 and a second apparatus 2001. The first apparatus 2000 includes a specifying part 201, a second control signal generation part 203, a simulator 204, a first adjustment part 205, and a second adjustment part 206. The second apparatus 2001 includes a first control signal generation part 202, a holding part 207, and a characteristic amount generation part 208. Except for the points described below, in FIG. 10, the configurations designated by the same reference numerals as those in FIG. 2 are the same as or have the same functions as the configurations shown in FIG. 2. Therefore, the description thereof will be omitted.

The holding part 207 holds measurement values measured every first cycle (e.g., several microseconds) by various sensors provided in the processing apparatus 100. Based on a plurality of measurement values of the same type held in the holding part 207, the characteristic amount generation part 208 generates a characteristic amount representing characteristics of the respective measurement values every second cycle (several hundred microseconds) that is longer than the first cycle. Then, the characteristic amount generation part 208 outputs the generated characteristic amount to the first apparatus 2000. The characteristic amount is, for example, a maximum value of the measurement values, a minimum value of the measurement values, an average value of the measurement values, an approximation curve showing the tendency of change of the measurement values, or the like. By outputting the characteristic amount generated based on the plurality of measurement values to the first apparatus 2000, as compared with a case where all the plurality of measurement values are outputted to the first apparatus 2000, it is possible to reduce the amount of data transmitted between the first apparatus 2000 and the second apparatus 2001.

The first adjustment part 205 restores the measurement value corresponding to the characteristic amount generated by the characteristic amount generation part 208, and adjusts the value of the model parameter included in the model so that the difference between the restored measurement value and the output value of the simulator 204 becomes small. The first adjustment part 205 may calculate the characteristic amount based on the output value of the simulator 204, and may adjust the value of the model parameter included in the model so that the difference between the calculated characteristic amount and the characteristic amount generated by the characteristic amount generation part 208 becomes small.

In this regard, the amount of calculation of the second control signal generation part 203, the simulator 204, the first adjustment part 205 and the second adjustment part 206 is larger than that of calculation of the first control signal generation part 202. Therefore, the apparatus that implements the functions of the second control signal generation part 203, the simulator 204, the first adjustment part 205 and the second adjustment part 206 is required to have a higher processing capacity than the apparatus that implements the function of the first control signal generation part 202. However, since such an apparatus becomes large, it is difficult to arrange such an apparatus in the vicinity of the processing apparatus 100. Therefore, it is conceivable that the apparatus that implements the functions of the second control signal generation part 203, the simulator 204, the first adjustment part 205 and the second adjustment part 206 is installed at a location away from the processing apparatus 100, and is connected to the processing apparatus 100 via a communication cable.

In addition, the state of the processing apparatus 100 is changed from moment to moment. Particularly, when plasma is generated, the internal state of the processing apparatus 100 is changed in a shorter time. Therefore, the sensor provided in the processing apparatus 100 performs measurement at a cycle of several microseconds and outputs a measurement value to the control system 200. In addition, a plurality of sensors is provided in the processing apparatus 100, and measurement values are outputted from the respective sensors. Accordingly, the amount of measurement value data outputted from the processing apparatus 100 to the control system 200 per unit time is enormous.

Therefore, in a case in which the control system 200 and the processing apparatus 100 are connected via a communication cable, it is necessary to transmit the measurement value data by using a wideband communication method that goes through the communication cable. However, such a communication method has a problem of high cost.

Therefore, in the present embodiment, the control system 200 is divided into the first apparatus 2000 and the second apparatus 2001, and the second apparatus 2001 and the processing apparatus 100 are connected by a bus, whereby a communication band between the second apparatus 2001 and the processing apparatus 100 is secured. In addition, the first apparatus 2000 and the second apparatus 2001 are connected by a communication cable such as a LAN cable or the like. As a result, the degree of freedom in the arrangement of the first apparatus 2000 is improved, and the cost of the processing system 1 can be reduced.

The fourth embodiment has been described above. As described above, the control system 200 according to the present embodiment further includes the characteristic amount generation part that generates the characteristic amount, which represents the characteristics of the measurement value measured every first cycle, in each second cycle that is longer than the first cycle. The first adjustment part 205 adjusts the value of the model parameter included in the model so that the difference between the measurement value corresponding to the characteristic amount and the output value of the simulator 204 becomes small. The specifying part 201, the second control signal generation part 203, the simulator 204, the first adjustment part 205 and the second adjustment part 206 are implemented as one apparatus, and the first control signal generation part 202 and the characteristic amount generation part 208 are implemented as another apparatus. Thus, the degree of freedom in the arrangement of the first apparatus 2000 is improved, and the cost of the processing system 1 can be reduced.

[Others]

The technique disclosed herein is not limited to the above-described embodiments, and many modifications may be made within the scope of the gist thereof.

For example, in each of the above-described embodiments, the capacitively coupled plasma (CCP) has been described as an example of the plasma source used by the processing apparatus 100. However, the plasma source is not limited thereto. Examples of the plasma source other than the capacitively coupled plasma include inductively coupled plasma (ICP), microwave-excited surface wave plasma (SWP), electron cyclotron resonance plasma (ECP), and helicon-wave-excited plasma (HWP).

Furthermore, in each of the above-described embodiments, the apparatus that performs processing such as etching or the like on the substrate W using plasma has been described as an example of the processing apparatus 100. However, the technique disclosed herein is not limited thereto. For example, the technique disclosed herein may be applied to the control of the distribution of heat, pressure, flow rate or the like in a processing apparatus such as a heat treatment apparatus or a cleaning apparatus that does not use plasma.

According to the present disclosure in various aspects and embodiments, it is possible to stably control an internal state of a processing apparatus.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A control system, comprising:
a specifying part configured to, based on a recipe that describes conditions for processing a substrate, specify a model corresponding to a processing apparatus that processes the substrate and a control algorithm that generates a control signal for controlling the processing apparatus based on a measurement value measured by a measurement device provided in the processing apparatus so that a state of the processing apparatus becomes a predetermined state;
a simulator configured to simulate the state of the processing apparatus by using the model;
a first control signal generation part configured to generate a control signal based on the measurement value by using the control algorithm specified by the specifying part and input the control signal generated by the first control signal generation part to the processing apparatus;
a characteristic amount generation part configured to generate a characteristic amount, which represents characteristics of the measurement value measured every first cycle, in each second cycle that is longer than the first cycle;
a second control signal generation part configured to generate a control signal based on an output value of the simulator, which corresponds to the measurement value, by using the control algorithm specified by the specifying part, and input the control signal generated by the second control signal generation part to the simulator;
a first adjustment part configured to adjust a value of a model parameter included in the model so that a difference between the measurement value corresponding to the characteristic amount and the output value of the simulator is reduced; and
a second adjustment part configured to adjust a value of a control parameter included in the control algorithm used by the second control signal generation part so that an evaluation value calculated for the output value of the simulator using the model including the adjusted value of the model parameter becomes closer to a target value, wherein the first control signal generation part is configured to generate the control signal by using the value of the control parameter adjusted by the second adjustment part, and wherein the specifying part, the simulator, the second control signal generation part, the first adjustment part, and the second adjustment part constitute a first apparatus, and the first control signal generation part and the characteristic amount generation part constitute a second apparatus.

2. The control system of claim 1, wherein the specifying part is configured to specify a plurality of models based on the recipe, the first adjustment part is configured to adjust the model and the value of the model parameter included in the model for each of the plurality of models specified by the specifying part so that the difference between the measurement value and the output value of the simulator is reduced, and configured to specify a combination of the adjusted model and the adjusted value of the model parameter, in which the difference between the measurement value and the output value of the simulator corresponding to the measurement value is smallest, as the adjusted model and the adjusted value of the model parameter, and the second adjustment part is configured to adjust the value of the control parameter used in the second control signal generation part so that the evaluation value calculated for the output value of the simulator using the model including the value of the model parameter specified by the first adjustment part becomes closer to the target value.

3. The control system of claim 2, wherein the specifying part is configured to specify a plurality of control algorithms based on the recipe, the second adjustment part is configured to adjust the control algorithm and the value of the control parameter included in the control algorithm used in the second control signal generation part for each of the plurality of control algorithms specified by the specifying part so that the evaluation value calculated for the output value of the simulator using the model including the value of the model parameter specified by the first adjustment part becomes closer to the target value, and specify a combination of the adjusted control algorithm and the adjusted value of the control parameter, in which the evaluation value calculated for the output value of the simulator is closest to the target value, as the adjusted control algorithm and the adjusted value of the control parameter, and the first control signal generation part is configured to generate the control signal to be inputted to the processing apparatus based on the measurement value by using the control algorithm and the value of the control parameter specified by the second adjustment part.

4. The control system of claim 3, wherein the specifying part is configured to specify an initial value of the control parameter based on the recipe, the first control signal generation part is configured to generate the control signal based on the measurement value by using the control algorithm and the initial value of the control parameter specified by the specifying part and input the control signal generated by the first control signal generation part to the processing apparatus, and the specifying part is configured to specify the value of the control parameter adjusted by the second adjustment part as the initial value of the control parameter.

5. The control system of claim 4, wherein the recipe is configured to describe conditions for processing the substrate using a plasma, the processing apparatus is configured to process the substrate using the plasma, the model represents a state of the plasma, and the simulator is configured to simulate the state of the plasma inside the processing apparatus using the model.

6. The control system of claim 1, wherein the specifying part is configured to specify an initial value of the control parameter based on the recipe, the first control signal generation part is configured to generate the control signal based on the measurement value by using the control algorithm and the initial value of the control parameter specified by the specifying part and input the control signal generated by the first control signal generation part to the processing apparatus, and the specifying part is configured to specify the value of the control parameter adjusted by the second adjustment part as the initial value of the control parameter.

7. The control system of claim 1, wherein the specifying part is configured to, based on a history of the value of the control parameter adjusted by the second adjustment part, estimate a value conforming to a tendency of the history as an initial value of the control parameter, and the first control signal generation part is configured to generate the control signal based on the measurement value by using the control algorithm specified by the specifying part and the initial value of the control parameter estimated by the specifying part, and input the control signal generated by the first control signal generation part to the processing apparatus.

8. The control system of claim 1, wherein the recipe is configured to describe conditions for processing the substrate using a plasma, the processing apparatus is configured to process the substrate using the plasma, the model represents a state of the plasma, and the simulator is configured to simulate the state of the plasma inside the processing apparatus using the model.

9. A control method, comprising:

based on a recipe that describes conditions for processing a substrate, specifying, by a specifying part, a model corresponding to a processing apparatus that processes the substrate and a control algorithm that generates a control signal for controlling the processing apparatus based on a measurement value measured by a measurement device provided in the processing apparatus so that a state of the processing apparatus becomes a predetermined state;

generating, by a first control signal generation part, a control signal based on the measurement value by using the specified control algorithm and inputting the generated control signal based on the measurement value to the processing apparatus;

generating, by a characteristic amount generation part, a characteristic amount, which represents characteristics of the measurement value measured every first cycle, in each second cycle that is longer than the first cycle;

generating, by a second control signal generation part, a control signal based on an output value corresponding to the measurement value, as an output value of a simulator that simulates the state of the processing apparatus with the model, by using the specified control algorithm, and inputting the generated control signal based on the output value to the simulator;

adjusting, by a first adjustment part, a value of a model parameter included in the model so that a difference between the measurement value corresponding to the characteristic amount and the output value of the simulator is reduced; and adjusting, by a second adjustment part, a value of a control parameter included in the control algorithm so that an evaluation value calculated for the output value of the simulator using the model including the adjusted value of the model parameter becomes closer to a target value, wherein in the act of inputting the generated control signal to the processing apparatus, the control signal based on the measurement value is generated by using the adjusted value of the control parameter, and wherein the specifying part, the simulator, the second control signal generation part, the first adjustment part, and the second adjustment part constitute a first apparatus, and the first control signal generation part and the characteristic amount generation part constitute a second apparatus.

10. A non-transitory computer-readable recording medium storing a control program that causes a control system to execute a process of:

based on a recipe that describes conditions for processing a substrate, specifying, by a specifying part, a model corresponding to a processing apparatus that processes the substrate and a control algorithm that generates a control signal for controlling the processing apparatus based on a measurement value measured by a measurement device provided in the processing apparatus so that a state of the processing apparatus becomes a predetermined state;

generating, by a first control signal generation part, a control signal based on the measurement value by using the specified control algorithm and inputting the generated control signal based on the measurement value to the processing apparatus;

generating, by a characteristic amount generation part, a characteristic amount, which represents characteristics of the measurement value measured every first cycle, in each second cycle that is longer than the first cycle;

generating, by a second control signal generation part, a control signal based on an output value corresponding to the measurement value, as an output value of a simulator that simulates the state of the processing apparatus, by using the specified control algorithm, and inputting the generated control signal based on the output value to the simulator;

adjusting, by a first adjustment part, a value of a model parameter included in the model so that a difference between the measurement value corresponding to the characteristic amount and the output value of the simulator is reduced; and adjusting, by a second adjustment part, a value of a control parameter included in the control algorithm so that an evaluation value calculated for the output value of the simulator using the model including the adjusted value of the model parameter becomes closer to a target value, wherein in the act of inputting the generated control signal to the processing apparatus, the control signal based on the measurement value is generated by using the adjusted value of the control parameter, and wherein the specifying part, the simulator, the second control signal generation part, the first adjustment part, and the second adjustment part constitute a first apparatus, and the first control signal generation part and the characteristic amount generation part constitute a second apparatus.

11. A processing system, comprising:

a processing apparatus configured to process a substrate; and a control system configured to control the processing apparatus, wherein the control system includes:

a specifying part configured to, based on a recipe that describes conditions for processing the substrate, specify a model corresponding to the processing apparatus that processes the substrate and a control algorithm that generates a control signal for controlling the processing apparatus based on a measurement value measured by a measurement device provided in the processing apparatus so that a state of the processing apparatus becomes a predetermined state;

a simulator configured to simulate the state of the processing apparatus by using the model;

a first control signal generation part configured to generate a control signal based on the measurement value by using the control algorithm specified by the specifying part and configured to input the control signal generated by the first control signal generation part to the processing apparatus;

a characteristic amount generation part configured to generate a characteristic amount, which represents characteristics of the measurement value measured every first cycle, in each second cycle that is longer than the first cycle;

a second control signal generation part configured to generate a control signal based on an output value of the simulator, which corresponds to the measurement value, by using the control algorithm specified by the specifying part, and configured to input the control signal generated by the second control signal generation part to the simulator;

a first adjustment part configured to adjust a value of a model parameter included in the model so that a difference between the measurement value corresponding to the characteristic amount and the output value of the simulator is reduced; and a second adjustment part configured to adjust a value of a control parameter included in the control algorithm used by the second control signal generation part so that an evaluation value calculated for the output value of the simulator using the model including the adjusted value of the model parameter becomes closer to a target value, wherein the first control signal generation part is configured to generate the control signal by using the value of the control parameter adjusted by the second adjustment part, and wherein the specifying part, the simulator, the second control signal generation part, the first adjustment part, and the second adjustment part constitute a first apparatus, and the first control signal generation part and the characteristic amount generation part constitute a second apparatus.

\* \* \* \* \*